(12) United States Patent
Cho et al.

(10) Patent No.: US 6,730,565 B2
(45) Date of Patent: May 4, 2004

(54) METHOD OF FORMING FLASH MEMORY

(75) Inventors: Min-Soo Cho, Kyunggi-do (KR); Dong-Jun Kim, Kyunggi-do (KR); Jin-Woo Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/277,848

(22) Filed: Oct. 22, 2002

(65) Prior Publication Data

US 2003/0113969 A1 Jun. 19, 2003

(30) Foreign Application Priority Data

Dec. 18, 2001 (KR) .................................. 10-2001-80483

(51) Int. Cl.[7] ............................................ H10L 21/336
(52) U.S. Cl. ...................... 438/266; 438/258; 438/259; 438/257; 257/315; 257/317
(58) Field of Search ................. 438/257–259, 438/266–267; 257/315–317

(56) References Cited

U.S. PATENT DOCUMENTS

| 5,029,130 A | 7/1991 | Yeh ............................. 365/185 |
| 6,524,915 B2 * | 2/2003 | Kim et al. .................. 438/267 |
| 2003/0073276 A1 * | 4/2003 | Lin et al. ..................... 435/201 |

* cited by examiner

*Primary Examiner*—Dung A. Le
(74) *Attorney, Agent, or Firm*—Mills & Onello, LLP

(57) ABSTRACT

The present invention provides a method of forming a split gate type flash memory. After exposure of a floating gate layer between silicon nitride layers, a conductive layer spacer is formed on a sidewall of the silicon nitride layer pattern. The conductive layer spacer is formed in a floating gate of a later-completed flash memory to form a tip on which tunneling is centralized in an erase operation. That is, the spacer is formed on a sidewall of the silicon nitride layer pattern over the floating gate layer to form the tunneling tip.

20 Claims, 11 Drawing Sheets

METHOD OF FORMING FLASH MEMORY

RELATED APPLICATION

This application relies for priority upon Korean Patent Application No. 2001-80483, filed on Dec. 18, 2001, the contents of which are herein incorporated by reference in their entirety.

FIELD OF THE INVENTION

The present invention relates to a method of forming a flash memory and, more particularly, to a split gate type flash memory.

BACKGROUND OF THE INVENTION

Flash memories are non-volatile memory devices with a structure that is suitable for high integration density. Accordingly, recently, the flash memories are intensively studied and developed. In a conventional flash memory device, a memory cell gate pattern is made of a floating gate, a control gate, and a dielectric film interposed therebetween.

A novel dual gate type non-volatile memory is being developed, in which an erase operation is performed toward wordlines from a floating gate to generate a relatively lower erase voltage. Since the floating gate and a control gate of the novel memory are horizontally disposed, an opposite side thereof is relatively reduced and F-N tunneling is centralized to a tip of the floating gate (U. S. Pat. No. 5,029,130).

FIG. 1 and FIG. 2 are cross-sectional views illustrating programming and erasing methods performed in a cell transistor of a non-volatile memory device having a floating gate and a control gate that are horizontally separated with a dielectric film interposed therebetween.

Referring now to FIG. 1, for programming, a high voltage Vdd is applied to a common source line 21 and a threshold voltage Vth is applied to a control gate line 120. Further, a zero voltage (0V) is applied to a drain region 109 and a substrate 100. Thus, electrons are moved from the drain region 109 to a source region 110. By passing a tunneling gate insulating layer 15, the electrons are accumulated into the floating gate 130. That is, the programming is performed.

Referring now to FIG. 2, for erasing, a zero voltage (0V) is applied to the common source line 21 and a high voltage Vdd is applied to the control gate line 120. Further, a zero voltage (0V) is applied to the drain region 109 and the substrate 100. Thus, the electrons accumulated into the floating gate 130 are induced to the high voltage Vdd of the control gate line 120. The induced electrons are moved to the control gate line through the tunneling gate insulating layer 15. That is, the erasing is performed. Since an electric field is centralized to a tip 23 of the floating gate 130, the electrons of the floating gate 130 are moved to the control gate line 109 through an insulating layer adjacent to the tip 23.

FIG. 3 is a top plan view showing a layout in the case where a transistor device is realized in a cell area of a conventional split gate type flash memory. FIG. 4 through FIG. 8 are cross-sectional views, taken along a line A—A of FIG. 3, showing the steps of forming the layout of FIG. 3.

Referring now to FIG. 3, a device isolation layer 103 is formed to define an active region 101 that is formed along line A—A. A common source region or a common source line 21 is formed along a line C—C. A spacer oxide layer 115, a control gate line or a wordline 120, a spacer nitride layer 125, and a substrate-exposing part are formed parallel to both sides of the common source region 21 or the common source line.

At an intersection of the active region 101 and the substrate-exposing part, a drain region 109 is formed at a substrate. In the drain region 109, a bitline contact 107 will be formed in a subsequent process. As illustrated by bold lines, bitlines 105 are formed along the line A—A to cover the active region 101. At an intersection of the active region 101 and the spacer oxide layer 115, a floating gate 130 is formed under the spacer oxide layer 115.

Referring now to FIG. 3 and FIG. 4, after stacking a tunneling gate insulating layer 15 and a floating gate layer on a substrate 100, a trench type field oxide layer (trench type device isolation layer 103 of FIG. 3) is formed. The floating gate layer is partially removed to remain as a floating gate pattern 131. Alternatively, a tunneling gate insulating layer and a floating gate layer are formed on a device-isolated substrate and by a patterning process, the floating gate pattern may remain only over the active region. A silicon nitride layer 115 is formed on an entire surface of the substrate 100, and then a patterning process is carried out to form a silicon nitride pattern 135 exposing the common source region 110 and the spacer oxide layer 115 of FIG. 3. The floating gate pattern 131 exposed between the silicon nitride patterns 135 is partially subjected to the thermal oxidation. An upper part of the floating gate pattern 135 is then oxidized to cause a bird's beak where an oxide layer 133 penetrates into a lower part of the silicon nitride pattern 135 at an interface between the patterns 131 and 135.

Referring to now FIG. 3 and FIG. 5, a silicon oxide layer for a spacer is conformally formed on an entire surface of a substrate where the oxidized upper part of the floating gate pattern 131 is removed or unremoved. The silicon oxide layer is etched back to make the spacer oxide layer 115 remain on a sidewall of the silicon oxide layer pattern 135. An unoxidized floating gate pattern 131 is exposed between the spacer oxide layers 115. Using the spacer oxide layer 115 and the silicon nitride pattern 135 as an etch mask, the floating gate pattern 131 is continuously etched to remove the exposed floating gate pattern 131. Concurrently, a tunneling gate insulating layer 15 is removed to expose the substrate 100. Afterwards, impurities are implanted to form a source region 110 at an exposed substrate 100. In one embodiment, this is performed with a dose of $10^{15}$ ions/cm$^2$. In a subsequent annealing process, the source region 110 will be extended to partially overlap with a floating gate region.

A section of the floating gate pattern 131 is exposed to a lower part of the spacer oxide layer 115 at a substrate 100 exposed to the source region 110. After/before the implantation of the impurities, a thermal oxidation process is performed or a thin CVD oxide layer is formed to cover the section of the floating gate layer 131.

Referring now to FIG. 3 and FIG. 6, the silicon oxide layer of the source region 110 is removed. A polysilicon layer is then stacked on an entire surface of the substrate to fill a space between the spacer oxide layers. By means of a CMP or an etch-back technique, the polysilicon layer is removed on an upper surface of the silicon nitride pattern 135. As a result, the polysilicon layer remains only in the space between the spacer oxide layers 115 to form a common source line 21.

Referring now to FIG. 3 and FIG. 7, the silicon nitride pattern 135 is removed by phosphoric acid or the like. By means of an anisotropic etch using the spacer oxide layer 115 as an etch mask, the floating gate pattern 131 is removed to form a floating gate 130. Concurrently, an upper part of the common source line 21 may be partially removed. Further, the tunneling gate insulating layer 15 may be concurrently removed to expose the substrate 100. A thin CVD oxide layer is conformally formed on an entire surface of the substrate 100. Alternatively, a thermal oxidation process is carried out to form an oxide layer 116 covering a sidewall of the floating gate 130 exposed below the spacer oxide layer 115 and the exposed substrate 100. During this procedure, the sidewall of the floating gate 130 may be partially oxidized to be laterally protruded.

Referring now to FIG. 8, a polysilicon layer 143 and a silicon nitride layer 145 are conformally formed on an entire surface of the substrate 100 in order to form a control gate or a wordline. The silicon nitride layer 145 may be substituted by a silicon oxynitride layer or the like.

Referring now to FIG. 9, an entire surface of the resultant structure of FIG. 8 is planarized by a CMP process to be even with a top surface of the common source line 21. Thus, the polysilicon layer 143' is exposed toward the side of the spacer oxide layer 115. On the other hand, the polysilicon layer 143' covered with a silicon nitride layer 145' is not exposed. An exposed common source line 21 and the exposed polysilicon layer 143' are thermally oxidized to form a silicon oxide layer 147.

Referring now to FIG. 10, using the silicon oxide layer 147 and the space oxide layer 115 as an etch mask, the silicon nitride layer 145' and the polysilicon layer 143' are sequentially removed. Thus, a polysilicon pattern remains on an opposite side of the common source line 21 of the spacer oxide layer 115 to form a wordline 120.

Alternatively, in the steps of FIG. 8, the polysilicon layer 143 is conformally stacked and anisotropically etched back to make a spacer-shaped polysilicon pattern remain on a sidewall of the spacer oxide layer 115.

Referring now to FIG. 11, another silicon nitride layer is stacked and anisotropically etched back to make the spacer nitride layer 125 remain on the opposite side of the spacer oxide layer 115 of the wordline 120. Heavily doped impurities are implanted into an exposed active region of the substrate 100 to form a drain region 109. In a subsequent annealing process, the drain region 109 may be extended toward a lower part of the spacer nitride layer 125.

After stacking and planarizing an interlayer insulating layer on an entire surface of a resultant structure, a bitline contact hole is formed. A conductive layer, i.e., a metal layer, is stacked on the bitline. The conductive layer is then patterned to form a bitline contact and a bitline.

A cell transistor of a flash memory formed by the foregoing procedure has a few drawbacks. For example, in order to expedite an erase operation, a tip of a floating gate is formed with an acute angle so that an electric field may be concentrated on the tip, as shown in FIG. 2. With reference to a procedure of forming the floating gate in FIG. 4 through FIG. 8, key steps of forming the tip with an acute angle lie in FIG. 4 and FIG. 8. In the step of partially oxidizing the floating gate pattern 131 of FIG. 4, a bird's beak of both ends of an oxide layer 131 must be short and steep-sloped. In the etching step of FIG. 8, the floating gate pattern 131 must be anisotropically etched.

But in the oxidizing step of FIG. 4, only an upper part of the floating gate pattern 131 must be oxidized because a lower part thereof is to be a floating gate. Due to this restriction, it is hard to form a thick oxide layer by thermally oxidizing the upper part of the floating gate pattern 131. It is also hard to form a steep-sloped bird's beak at an interface between the floating gate pattern 131 and the silicon nitride pattern 135. As a result, it is hard to form a tip (23 of FIG. 1) with an acute angle.

Furthermore, when the floating gate pattern 131 is partially oxidized (FIG. 4), the oxidization is not limited thereto. As shown in FIG. 12A taken along a line B—B of FIG. 3, an upper part of the floating gate pattern 131 as well as a lateral part 134 adjacent to the device isolation layer 103 is exposed. Therefore, as shown in FIG. 12B, a lateral part 134 and a lower part 151 are oxidized by oxygen that is introduced through the lateral part when an upper oxide layer 133 of the floating gate pattern 131 is formed.

When a lower part of the floating gate pattern 131 is oxidized near the device isolation layer 103, the tunneling gate insulating layer 15 is to be thick at both lateral parts of a channel (see 151 of FIG. 12B). In a program operation, it is difficult for electrons to pass the thick tunneling gate insulating layer. Therefore, it takes a longer time to accumulate electrons in a floating gate. That is, a program operation speed is lowered in a cell memory transistor.

Moreover, when the lateral part 134 of the floating gate pattern is oxidized, an active region is partially covered with the oxidized lateral part 134, as partially shown in FIG. 12B. In the etch-back for forming the spacer oxide layer 115 of FIG. 5, the oxidized lateral part 134 is removed to expose the substrate 100 adjacent to the floating gate pattern 131. When the floating gate pattern 131 is etched for exposing a source region, the exposed substrate 100 is etched.

As a result, in FIG. 13 taken along a line C—C of FIG. 3, a substrate 20 contacted with both edges of the source region 110 is removed to form grooves 161, which is called a pitting phenomenon. If implantation of ions into the common source region 110 is not sufficiently deep, a common source line part filling the groove 161 is in direct contact with a neighboring substrate 100 to cause a leakage current.

SUMMARY OF THE INVENTION

An object of the invention is to provide a method of forming a split gate type flash memory where a tip is formed with an acute angle.

Another object of the invention is to provide a method of forming a split gate type flash memory that prevents a gate insulating layer below a floating gate from becoming thick.

Still another object of the invention is to provide a split gate type flash memory that prevents a pitting phenomenon and a leakage current in a source region.

The present invention provides a method of forming a split gate type flash memory. The invention comprises exposing a floating gate layer between silicon nitride patterns. A conductive layer spacer is formed on a sidewall of the silicon nitride pattern, and subsequent processes are carried out. In the flash memory, the conductive layer spacer forms a tip of the floating gate. Conventionally, the exposed floating gate layer is oxidized to form a bird's beak. This part is anisotropically etched to a tunneling tip of the floating gate. However, in this invention, a spacer is formed on the sidewall of the silicon nitride pattern to form a tunneling tip over the floating gate layer.

According to an aspect of the invention, in a method of forming a split gate type flash memory, a tunneling gate insulating layer and a first conductive layer are formed on a substrate. An auxiliary layer pattern is formed on the first conductive layer. The auxiliary layer pattern includes a linear gap along a first direction, and has an etch selectivity with respect to the first conductive layer. A second conductive layer is conformally stacked and etched back to form a second conductive layer spacer on a sidewall of the auxiliary layer pattern. The second conductive layer spacer is coupled to the first conductive layer. A first insulating material layer is conformally stacked on the second conductive layer spacer. The first insulating material layer has an etch selectivity with respect to the first conductive layer and the auxiliary layer. The first insulating material layer is anisotropically etched back to form a first spacer so that the linear gap is partially filled and the first conductive layer is exposed to the center of the linear gap.

In one embodiment, the first and second conductive layers include polysilicon. The auxiliary layer includes silicon nitride. The first insulating material layer includes CVD oxide.

In the present invention, a trench type device isolation layer is generally formed after stacking the tunneling gate insulating layer and the first conductive layer. In this case, a second conductive layer pattern is formed, and then a surface thereof is oxidized.

Alternatively, the device isolation layer may be formed before formation of the tunneling gate insulating layer. If the first conductive layer is formed after formation of the device isolation layer, the first conductive layer is patterned. In the case where the first conductive layer is patterned, the first conductive layer and the second conductive layer spacer are removed along a second direction across the first direction. Thus, isolation is clearly accomplished between neighboring floating gates.

As described above, a second conductive layer spacer is formed when a first conductive layer is exposed between auxiliary layer patterns. Alternatively, a surface of the first conductive layer for forming a bird's beak is first oxidized. After removing an oxidized part of the first conductive layer, the second conductive layer spacer is formed to strengthen the tip. Preferably, the surface of the first conductive layer is oxidized after forming the second conductive layer spacer.

Processes following formation of the first spacer may be the same as those in a conventional method of forming a split gate type flash memory. That is, using the first spacer and the auxiliary layer pattern as an etch mask, the first conductive layer is etched to be removed. Using the first spacer and the auxiliary layer pattern as an ion implanting mask, impurities are implanted to form a source region at a central substrate of the linear gap. A conductive layer is stacked and planarized to form a common source line coupled to the source region. After the auxiliary layer pattern is etched and removed, the first conductive layer below the auxiliary layer pattern is anisotropically etched and removed to form a floating gate. The floating gate includes a first conductive layer remaining below the fist spacer and a second conductive layer spacer. A fourth conductive layer pattern, which is contacted with a sidewall of the first spacer exposed by removing the auxiliary layer pattern, is formed to constitute a wordline. As a subsequent process, impurities are implanted into a drain region. In addition, before formation of the drain region, a second spacer may be formed on a sidewall of the wordline. The second spacer is made of a second insulating material such as, for example, silicon nitride.

In order to form the wordline, a fourth conductive layer is conformally stacked. A second auxiliary layer is conformally stacked on the fourth conductive layer. An entire surface of the substrate is planarized to be upper than the fourth conductive layer. The exposed common source line and a surface of the fourth conductive layer are thermally oxidized to form an oxide layer. Using the oxide layer as an etch mask, the second auxiliary layer and the fourth conductive layer are anisotropically etched. The fourth and third conductive layers are made of polysilicon. The second conductive layer includes silicon nitride or silicon oxynitride.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
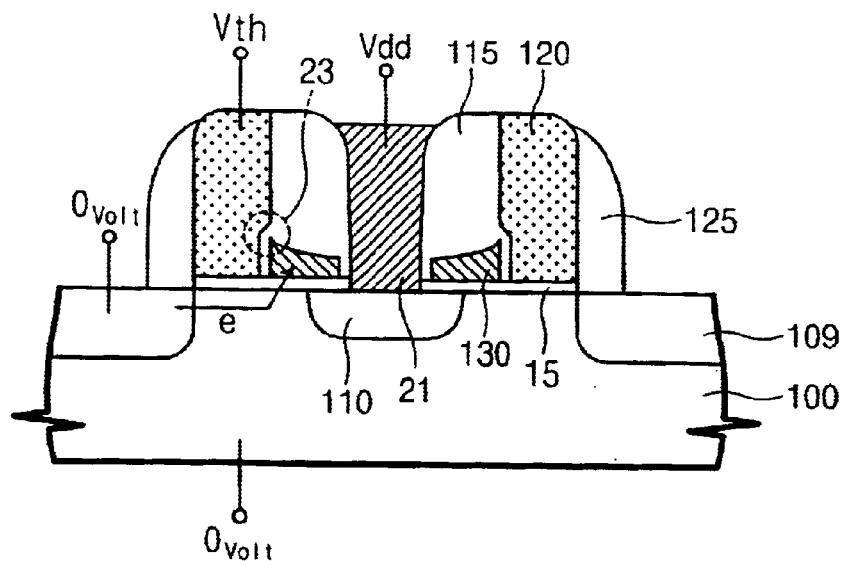
FIG. 1 and FIG. 2 are cross-sectional views illustrating programming and erasing methods performed in a cell transistor of a split gate type non-volatile memory device.
Figure 2:
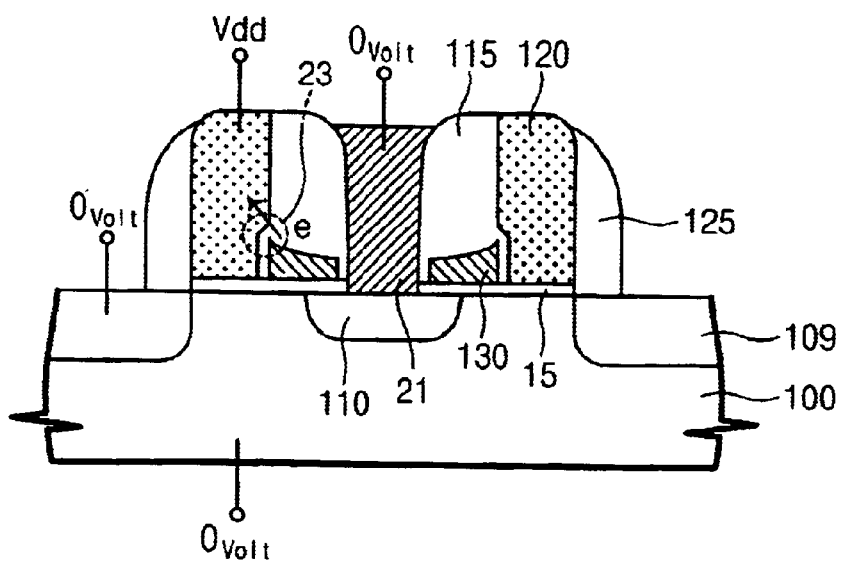
Figure 3:
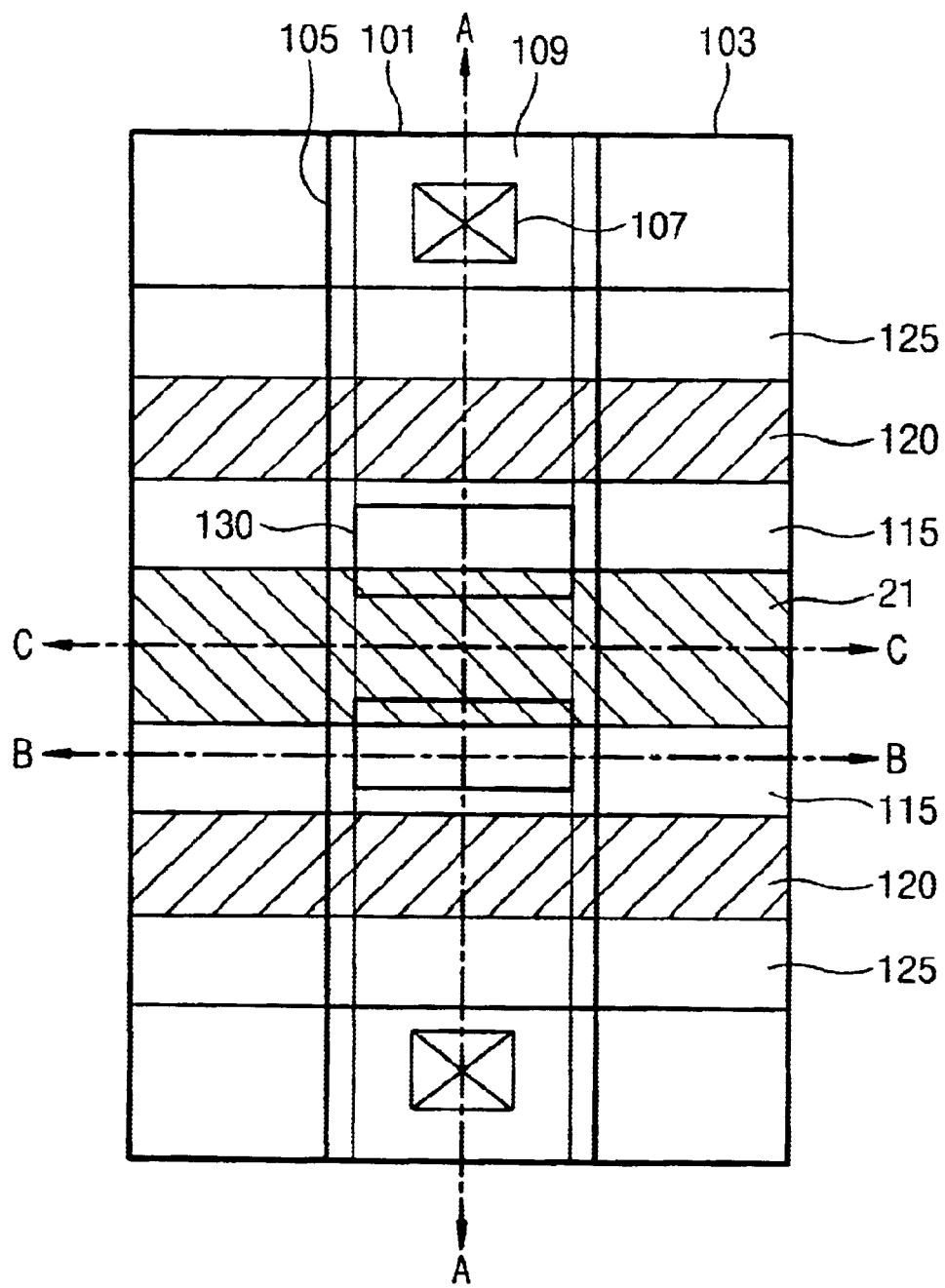
FIG. 3 is a top plan view of a layout where a transistor device is constructed in a cell region of a conventional split gate type flash memory.
Figure 4:
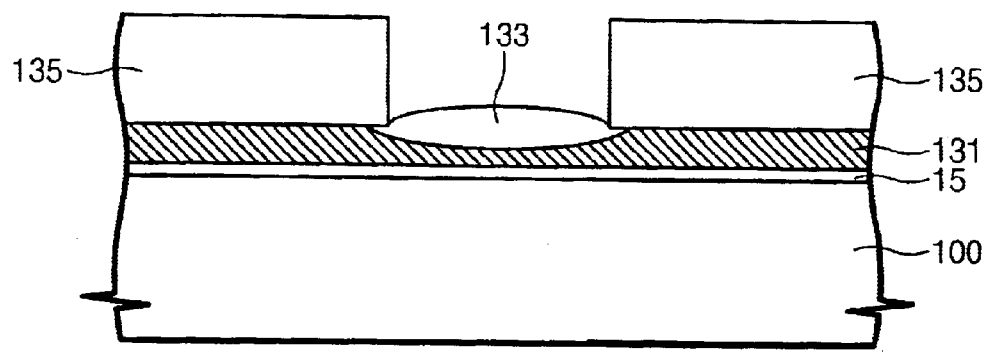
FIG. 4 through FIG. 11 are cross-sectional views, taken along a line A—A of FIG. 3, showing partial steps of forming the layout shown in FIG. 3.
Figure 14A:
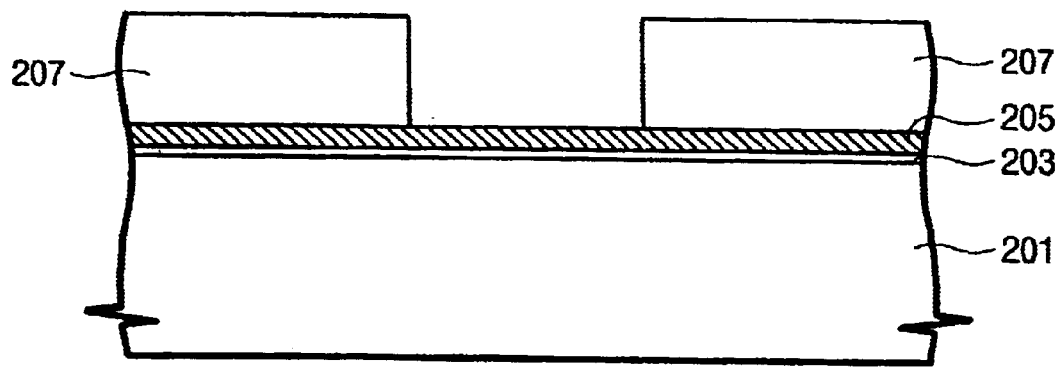
FIG. 14A through FIG. 17B are cross-sectional views showing the present invention.
Figure 14B:
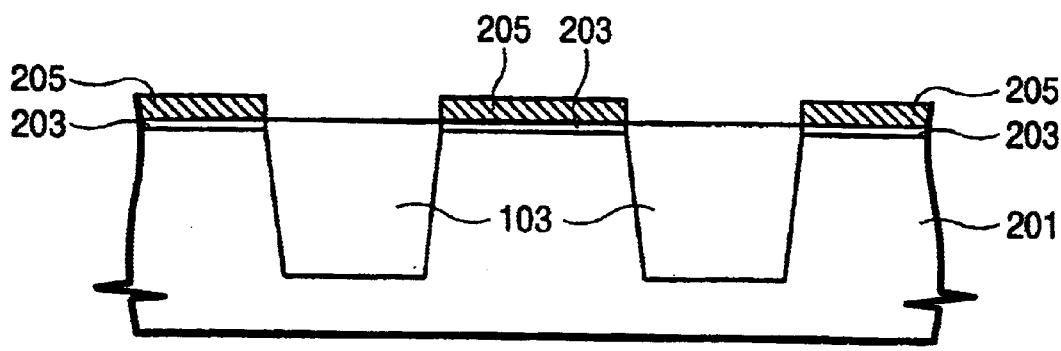

FIG. 14A through FIG. 17B are cross-sectional views illustrating the present invention. FIGS. 14A, 15A, 16A and 17A are analogous to cross sections taken along line A—A of FIG. 3. FIGS. 14B, 15B, 16B and 17B are analogous to cross sections taken along line C—C of FIG. 3. Referring to FIGS. 14A and 14B, a substrate 201 is thermally oxidized to form a tunneling gate insulating layer 203 thereon to a thickness of 50–100 angstroms. A first conductive layer 205 is formed on the tunneling gate insulating layer 203. The first conductive layer 205 is made of polysilicon to a thickness of 400 angstroms. The first conductive layer 205 is patterned to form a trench type device isolation layer at the substrate 201. Similar to the case of FIG. 1, an active region is formed along one direction over the substrate 201. An active region 101 is formed across a device isolation layer 103 or a field oxide layer. The tunneling gate insulating layer 203 and the first conductive layer pattern 205 sequentially cover the active region. After formation of an etch-stop layer pattern used for forming the device isolation layer 103, an auxiliary layer is formed on an entire surface of the substrate 201. The auxiliary layer is made of silicon nitride to a thickness of 3000–4000 angstroms. The auxiliary layer is patterned to form an auxiliary layer pattern 207 having a gap along a first direction that is perpendicular to the one direction. In this case, the first conductive layer pattern 205 covers an active region exposed by the gap, and the device isolation layer 103 is slightly etched in a cleaning process or the like to be nearly even with the substrate 201.

Figure 15A:
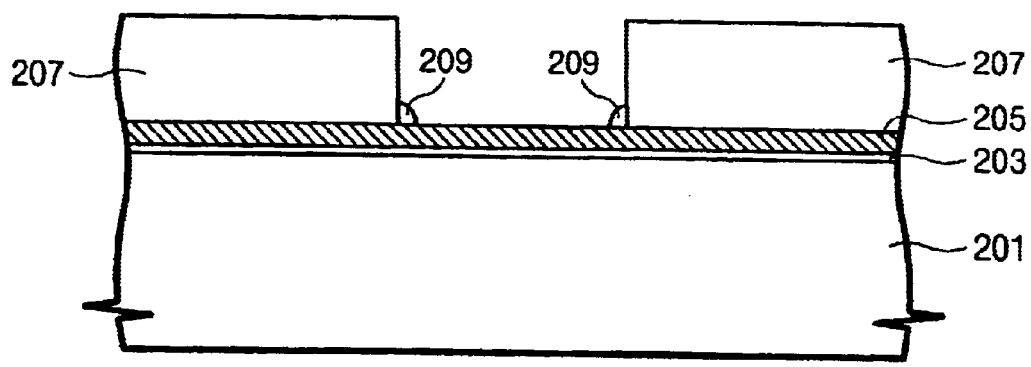
Figure 15B:
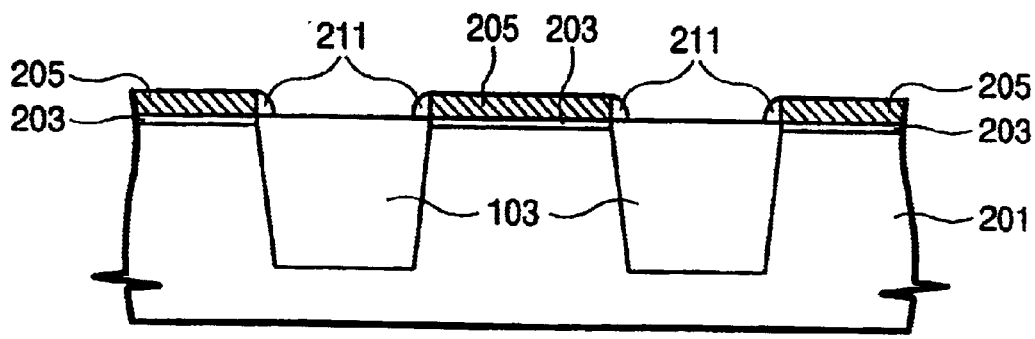

Referring to FIGS. 15A and 15B, a second conductive layer is conformally stacked on an entire surface of the substrate 201. The second conductive layer is made of polysilicon to a thickness of 200–300 angstroms. Before formation of the second conductive layer, a thermal oxide layer may be formed on the first conductive layer pattern 205 that is already exposed by thermally oxidizing the substrate 201. After causing a bird's beak at a boundary of the auxiliary layer pattern 207, the thermal oxide layer may be removed. The second conductive layer is anisotropically etched back to a second conductive layer spacer 209 on a sidewall of the auxiliary layer pattern 207. A spacer 211 is also formed at a step between the first conductive layer pattern 205 and the device isolation layer 103. Preferably, a height of the second conductive layer spacer 209 is lowered by reducing an etching anisotropy.

Figure 16A:
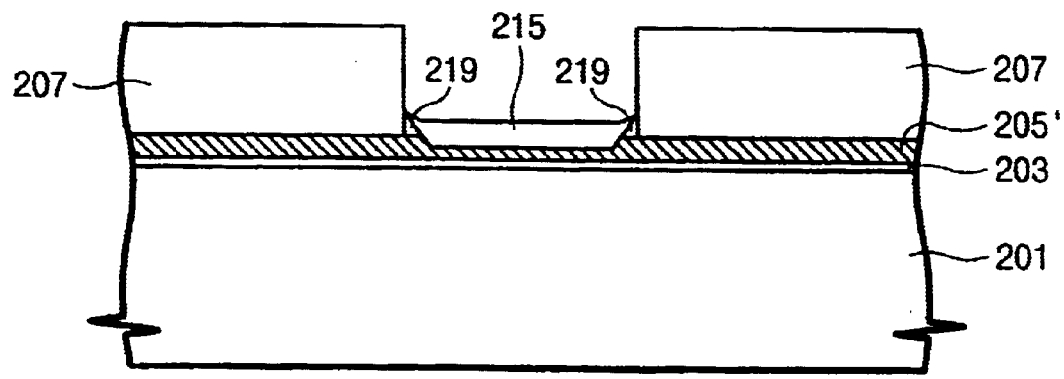
Figure 16B:
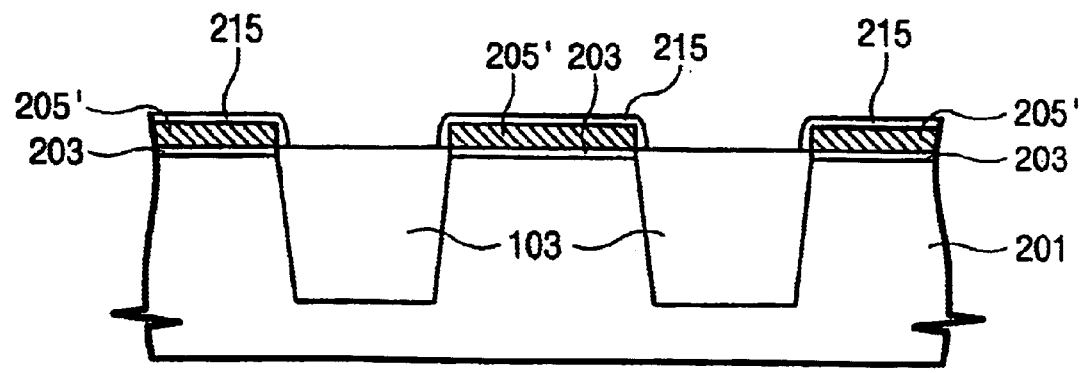

Referring to FIGS. 16A and 16B, the structure, where the second conductive layer spacer 209 is formed, is thermally oxidized to form a thermal oxide layer 215 on the second conductive layer spacer 209 and the first conductive layer pattern 205. In this case, as shown in FIG. 16A, a contacted part of the spacer 209 with the auxiliary layer pattern 207 and a first conductive layer pattern 205', i.e., an inner part of the spacer 209 is not thermally oxidized and remains as a conductive layer. Thus, it is possible to form a sharp tip of a later-completed floating gate. A spacer 211 of FIG. 15B serves to prevent oxygen from diffusing into a substrate of an active region during the thermal oxidation, as shown in FIG. 15B. The spacer 211 is almost oxidized itself, but fairly suppresses oxidation of a substrate and the first conductive layer pattern 205'. As a result, the tunneling gate insulating layer 203 around the device isolation layer 103 does not become thick. Moreover, a sidewall of the first conductive layer pattern 205 is oxidized and removed in a subsequent process to prevent a pitting phenomenon from occurring at both sides of a source region.

Although a second conductive layer spacer is formed on a bottom sidewall of an auxiliary layer to remain in a device isolation layer region, it is almost oxidized in a subsequent thermal oxidation process. Therefore, interconnection of the floating gates can be prevented. Particularly, in an embodiment where a tunneling gate insulating layer and a first conductive layer are formed after formation of a device isolation layer, a second conductive layer spacer is formed, and then a patterning process is carried out to remove the first and second conductive layer patterns over the device isolation layer. As a result, the interconnection of the floating gates is not as a central problem.

Figure 5:
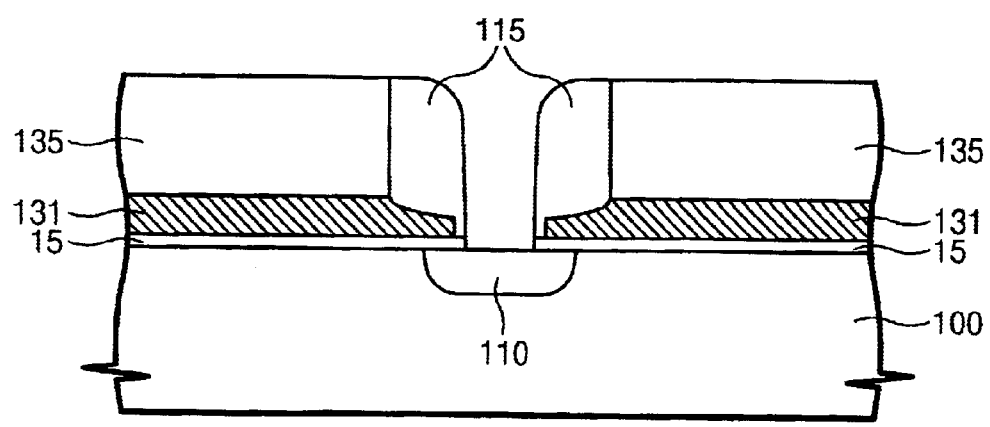
Figure 6:
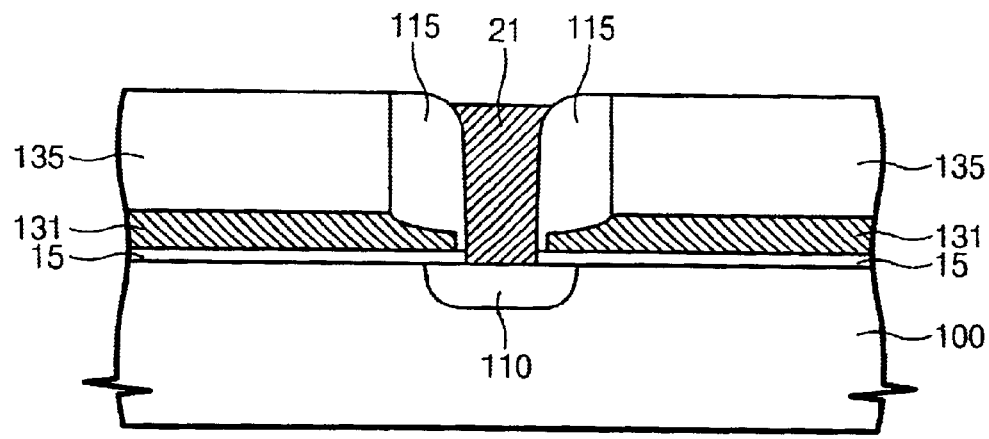
Figure 7:
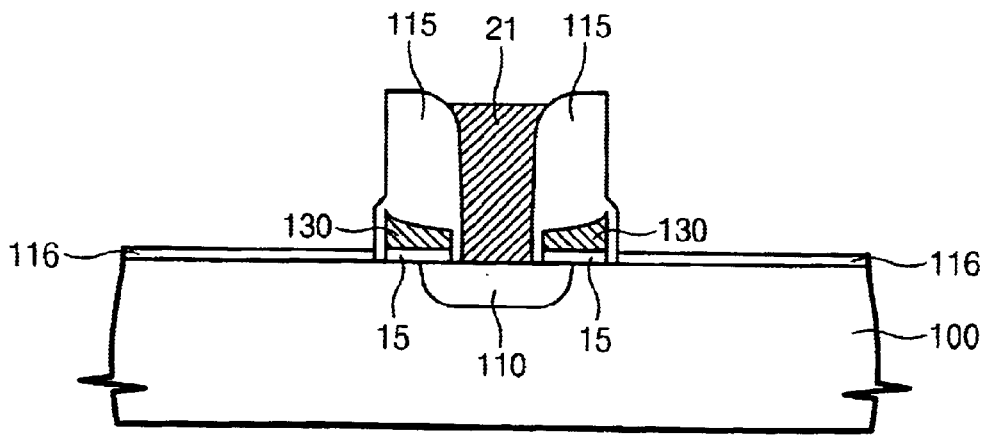
Figure 8:
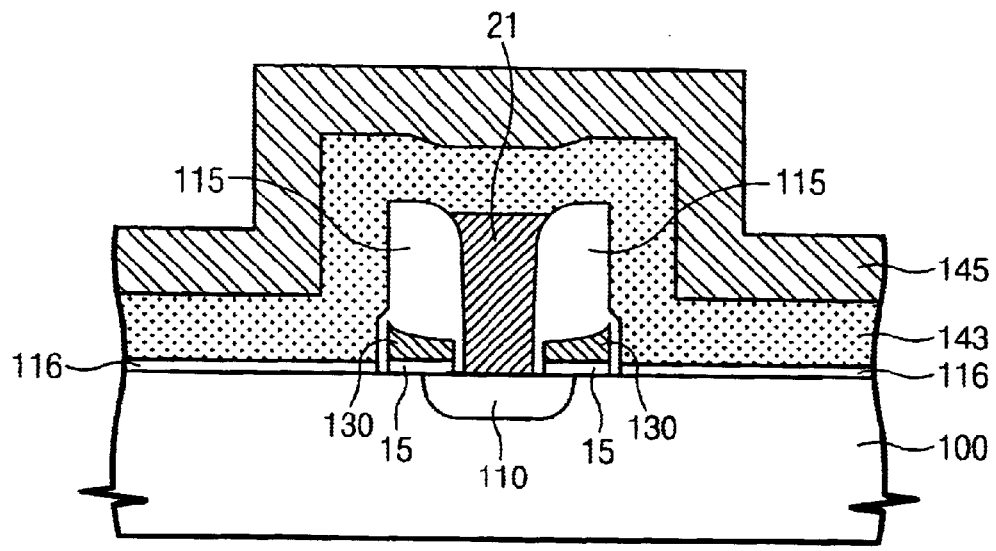
Figure 9:
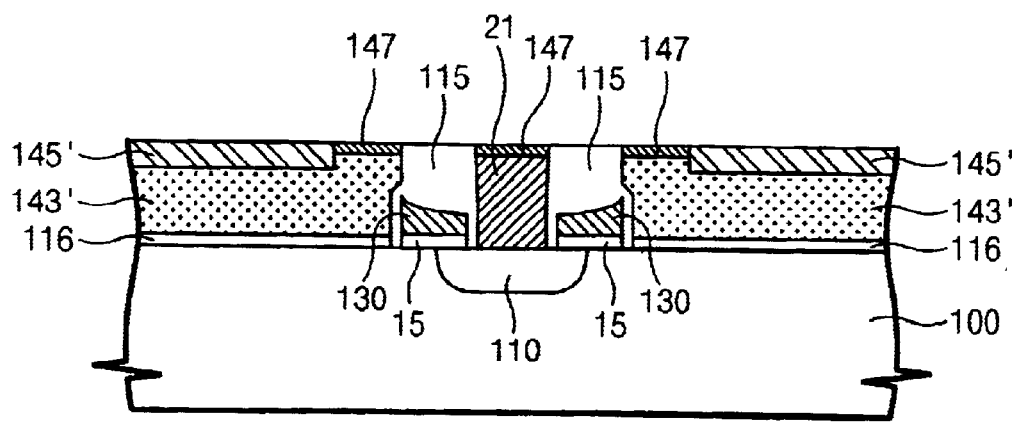
Figure 10:
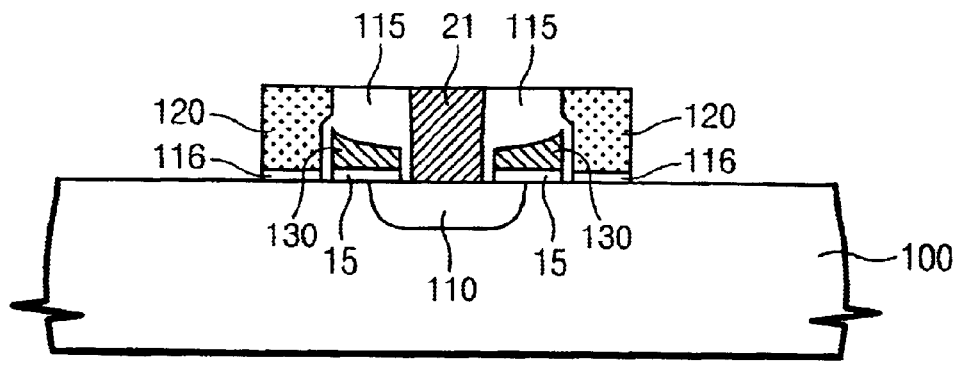
Figure 11:
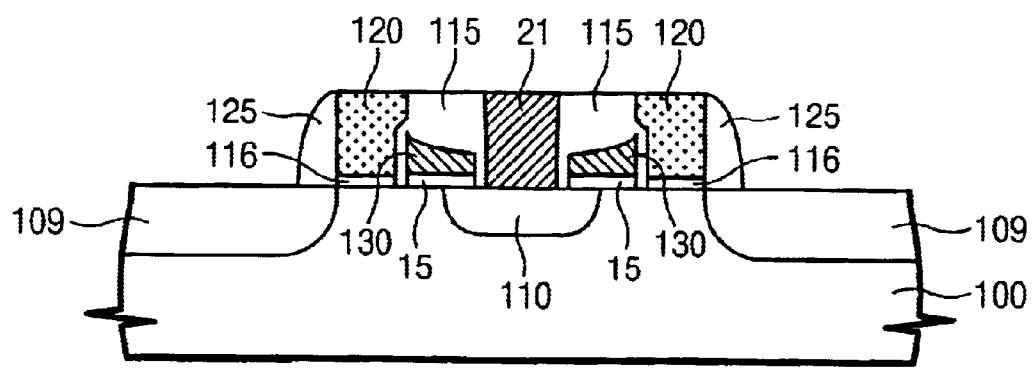
Figure 12A:
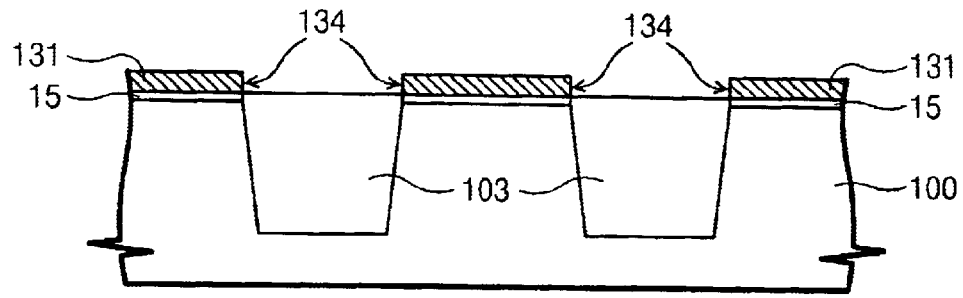
FIG. 12A and FIG. 12B are cross-sectional views, taken along a line B—B of FIG. 3, for illustrating drawbacks of the prior art.
Figure 12B:
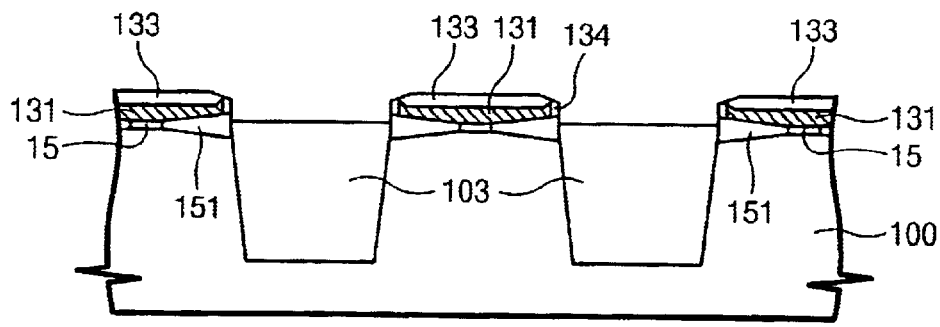
Figure 13:
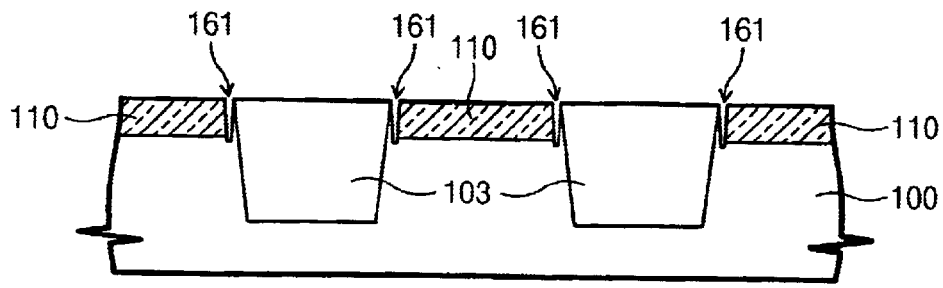
FIG. 13 is a cross-sectional view, taken along a line C—C of FIG. 3 in the step of FIG. 5, for illustrating drawbacks of the prior art.
Figure 17A:
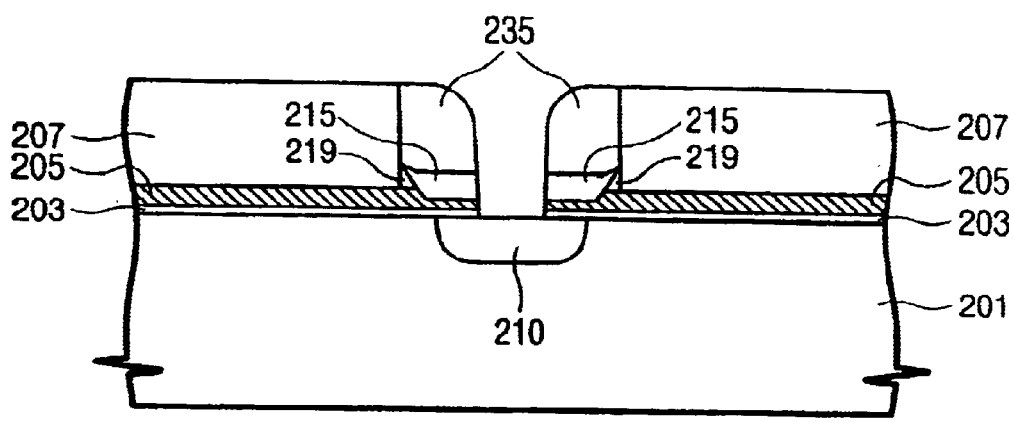
Figure 17B:
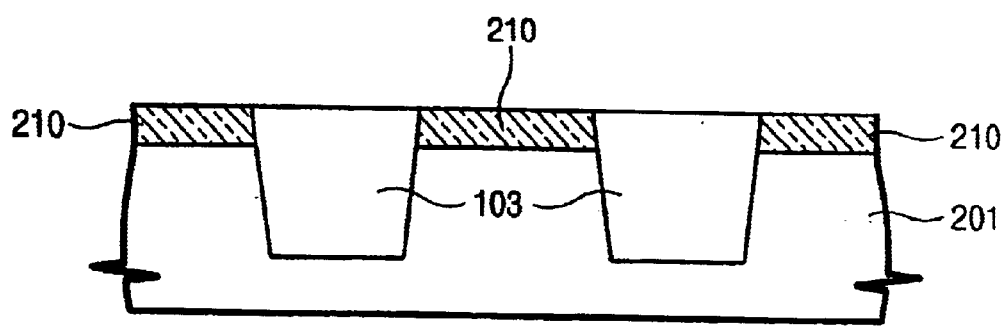

FIG. 17A and FIG. 17B are flow diagrams showing the post steps of forming a split gate type flash memory. Except a floating gate tip 219, the shapes are the same as those in FIG. 5.

The subsequent steps may also be the same as those in FIG. 6 through FIG. 11, and will be carried out without changes except the tip of the floating gate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming a split gate type flash memory device, comprising:

forming a tunneling gate insulating layer and a first conductive layer on a substrate;

forming an auxiliary layer pattern on the first conductive layer, the auxiliary layer including a linear gap in a first direction and having an etch selectivity with respect to the first conductive layer;

conformally stacking and etching back a second conductive layer on a substrate including the auxiliary layer pattern to form a second conductive layer spacer on a sidewall of the auxiliary layer pattern, the second conductive layer spacer being coupled to the first conductive layer;

performing thermal oxidation after forming the second conductive layer spacer;

conformally stacking a first insulating material layer on an entire surface of the substrate including the second conductive layer spacer, the first insulating material layer having an etch selectivity with respect to the first conductive layer and the auxiliary layer; and anisotropically etching back the first insulating material layer to form a first spacer on the sidewall of the auxiliary layer pattern, the first spacer filling a part of the linear gap and exposing the first conductive layer on the center of the linear gap.

2. The method of claim 1, wherein the first and second conductive layer comprise polysilicon, the auxiliary layer comprises silicon nitride, and the first insulating material layer comprises CVD oxide.

3. The method of claim 1, further comprising forming a trench type device isolation layer after stacking the first conductive layer.

4. The method of claim 1, further comprising:

forming a device isolation layer before forming the tunneling gate insulating layer; and removing the first conductive layer and the second conductive layer pattern on the device isolation layer along a second direction perpendicular to the first direction, before forming the tunneling gate insulating layer and after forming the device isolation layer.

5. The method of claim 1, further comprising:

oxidizing a surface of the first conductive layer in order to form a bird's beak at a boundary of the auxiliary layer pattern, between forming the auxiliary layer pattern and forming the second conductive layer spacer; and removing the oxidized surface of the first conductive layer.

6. The method of claim 1, further comprising, after forming the first spacer:

using the first spacer and the auxiliary layer pattern as an etch mask, etching the first conductive layer to be removed;

using the first spacer and the auxiliary pattern as an ion implanting mask, implanting impurities to form a common source region at a central substrate of the linear gap;

stacking and planarizing a third conductive layer to form a source line coupled to the source region;

etching the auxiliary layer pattern to be removed, and then anisotropically etching the first conductive layer below the auxiliary layer pattern to be removed; sidewall exposed by removing the auxiliary layer pattern; and implanting impurities into the exposed substrate to form a drain region.

7. The method of claim 6, further comprising forming a second spacer on a sidewall of the wordline before impurity implantation for forming the drain region, the second spacer being formed of an insulting layer.

8. The method of claim 6, wherein forming the wordline comprises:

conformally stacking the fourth conductive layer;

conformally stacking a second auxiliary layer on the fourth conductive layer;

planarizing a substrate entire surface, wherein the fourth conductive layer and the second auxiliary layer are formed to expose a portion of the fourth conductive layer adjacent to the first conductive layer;

thermally oxidizing the exposed common source line and the exposed fourth conductive layer to form an oxide layer; and using the oxide layer as an etch mask, anisotropically etching the second auxiliary layer and the fourth conductive layer.

9. The method of claim 8, wherein the third and fourth conductive layers comprise polysilicon.

10. The method of claim 8, wherein the second auxiliary layer comprises one of silicon nitride and silicon oxynitride.

11. A method of forming a split gate type flash memory device, comprising:

forming a tunneling gate insulating layer and a first conductive layer on a substrate, including a linear gap in a first direction and having an etch selectivity with respect to the first conductive layer;

conformally stacking and etching back a second conductive layer on a substrate including the auxiliary layer pattern to form a second conductive layer spacer on a sidewall of the auxiliary layer pattern, the second conductive layer spacer being couple to the first conductive layer;

oxidizing a surface of the first conductive layer in order to form a bird's beak at a boundary of the auxiliary layer pattern between forming the auxiliary layer pattern and forming the second conductive layer spacer, and removing the oxidized surface of the first conductive layer.

conformally stacking a first insulating material layer on an entire surface of the substrate including the second conductive layer spacer, the first insulating material layer having an etch selectivity with respect to the first conductive layer and the auxiliary layer; and anisotropically etching back the first insulating material layer to form a first spacer on the sidewall of the auxiliary layer pattern, the first spacer filling a part of the linear gap and exposing the fist conductive layer on the center of the linear gap.

12. The method of claim 11, wherein the first and second conductive layers comprise polysilicon, the auxiliary layer comprises silicon nitride, and the first insulating material layer comprises CVD oxide.

13. The method of claim 11, further comprising forming a trench type device isolation layer after stacking the first conductive layer.

14. The method of claim 11, further comprising performing thermal oxidation after forming the second conductive layer spacer.

15. The method of claim 11, further comprising:

forming a device isolation layer before forming the tunneling gate insulating layer; and removing the first conductive layer and the second conductive layer pattern on the device isolation layer along a second direction perpendicular to the first direction, before forming the tunneling gate insulating layer and after forming the device isolation layer.

16. The method of claim 11, further comprising, after forming the first spacer:

using the first spacer and the auxiliary layer pattern as an etch mask, etching the first conductive layer to be removed;

using the first spacer and the auxiliary pattern as an ion implanting mask, implanting impurities to form a common source region at a central substrate of the linear gap;

stacking and planarizing a third conductive layer to form a source line coupled to the source region;

etching the auxiliary layer pattern to be removed, and then anisotropically etching the first conductive layer below the auxiliary layer pattern to be removed;

forming a wordline using a fourth conductive layer pattern contacted with the first spacer sidewall exposed by removing the auxiliary layer pattern; and implanting impurities into the exposed substrate to form a drain region.

17. The method of claim 16, further comprising forming a second spacer on a sidewall of the wordline before impurity implantation for forming the drain region, the second spacer being formed of an insulating layer.

18. The method of claim 16, wherein forming the wordline comprises:

conformally stacking the fourth conductive layer;

conformally stacking a second auxiliary layer on the fourth conductive layer; auxiliary layer are formed to expose a portion of the fourth conductive layer adjacent to the first conductive layer;

thermally oxidizing the exposed common source line and the exposed fourth conductive layer to form an oxide layer; and using the oxide layer as an etch mask, anisotropically etching the second auxiliary layer and the fourth conductive layer.

19. The method of claim 18, wherein the third and fourth conductive layers comprise polysilicon.

20. The method of claim 18, wherein the second auxiliary layer comprises one of silicon nitride and silicon oxynitride.

* * * * *

UNITED STATES PATENT AND TRADEMARK OFFICE
CERTIFICATE OF CORRECTION

PATENT NO. : 6,730,565 B2 Page 1 of 1
DATED : May 4, 2004
INVENTOR(S) : Min-Soo Cho et al.

It is certified that error appears in the above-identified patent and that said Letters Patent is hereby corrected as shown below:

Column 8,
Line 24, please delete "layer" and insert -- layers --.
Line 58, please insert -- forming a wordline using a fourth conductive layer pattern contacted with the first spacer -- after "removed;".

Column 9,
Line 24, please delete "substrate," and insert -- substrate;-- and insert -- forming an auxiliary layer pattern on the first conductive layer, the auxiliary layer -- after "substrate;".
Line 38, please delete "layer." and insert -- layer; --.

Column 10,
Line 39, please insert -- planarizing a substrate entire surface, wherein the fourth conductive layer and the second -- after "layer;".

Signed and Sealed this

Thirty-first Day of May, 2005

JON W. DUDAS
*Director of the United States Patent and Trademark Office*